United States Patent
Nakajima

(10) Patent No.: US 8,492,829 B2
(45) Date of Patent: Jul. 23, 2013

(54) SEMICONDUCTOR DEVICE HAVING SUPER JUNCTION METAL OXIDE SEMICONDUCTOR STRUCTURE AND FABRICATION METHOD FOR THE SAME

(75) Inventor: Toshio Nakajima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 3 days.

(21) Appl. No.: 12/737,912

(22) PCT Filed: Aug. 31, 2009

(86) PCT No.: PCT/JP2009/065171
§ 371 (c)(1),
(2), (4) Date: Feb. 28, 2011

(87) PCT Pub. No.: WO2010/024433
PCT Pub. Date: Mar. 4, 2010

(65) Prior Publication Data
US 2011/0147829 A1      Jun. 23, 2011

(30) Foreign Application Priority Data

Sep. 1, 2008 (JP) .................................. 2008-223370

(51) Int. Cl.
*H01L 29/78* (2006.01)
(52) U.S. Cl.
USPC ........... 257/329; 257/328; 257/401; 257/607; 257/612
(58) Field of Classification Search
USPC .......................... 257/329, 328, 401, 607, 612
See application file for complete search history.

(56) References Cited

U.S. PATENT DOCUMENTS

| 4,053,925 A | * | 10/1977 | Burr et al. ...................... 257/376 |
| 4,762,802 A | * | 8/1988 | Parrillo .......................... 438/220 |
| 5,759,904 A | * | 6/1998 | Dearnaley ...................... 438/528 |

(Continued)

FOREIGN PATENT DOCUMENTS

| JP | 62-219664 A | 9/1987 |
| JP | 62-298120 A | 12/1987 |

(Continued)

*Primary Examiner* — Eugene Lee
(74) *Attorney, Agent, or Firm* — Rabin & Berdo, P.C.

(57) ABSTRACT

Provided are a semiconductor device which can shorten reverse recovery time without increasing leakage current between the drain and the source, and a fabrication method for such semiconductor device.

The semiconductor device includes: a first base layer (12); a drain layer (10) disposed on the back side surface of the first base layer (12); a second base layer (16) formed on the surface of the first base layer (12); a source layer (18) formed on the surface of the second base layer (16); a gate insulating film (20) disposed on the surface of both the source layer (18) and the second base layer (16); a gate electrode (22) disposed on the gate insulating film (20); a column layer (14) formed in the first base layer (12) of the lower part of both the second base layer (16) and the source layer (18) by opposing the drain layer (10); a drain electrode (28) disposed in the drain layer (10); and a source electrode (26) disposed on both the source layer and the second base layer, wherein heavy particle irradiation is performed to the column layer (14) to form a trap level locally.

8 Claims, 10 Drawing Sheets

U.S. PATENT DOCUMENTS

| | | | |
|---|---|---|---|
| 6,168,981 B1 * | 1/2001 | Battaglia et al. | 438/164 |
| 6,509,240 B2 * | 1/2003 | Ren et al. | 438/302 |
| 6,709,955 B2 * | 3/2004 | Saggio et al. | 438/473 |
| 6,768,167 B2 * | 7/2004 | Nagaoka et al. | 257/329 |
| 6,768,170 B2 * | 7/2004 | Zhou | 257/341 |
| 6,838,321 B2 * | 1/2005 | Kaneda et al. | 438/133 |
| 6,838,729 B2 * | 1/2005 | Schlogl et al. | 257/328 |
| 6,870,199 B1 * | 3/2005 | Yoshikawa et al. | 257/131 |
| 7,518,197 B2 * | 4/2009 | Yamaguchi | 257/401 |
| 7,586,148 B2 * | 9/2009 | Blanchard | 257/328 |
| 7,767,500 B2 * | 8/2010 | Sridevan | 438/132 |
| 7,968,953 B2 * | 6/2011 | Sakakibara et al. | 257/401 |
| 2006/0151829 A1 * | 7/2006 | Sakamoto | 257/327 |

FOREIGN PATENT DOCUMENTS

| | | |
|---|---|---|
| JP | 63-115383 A | 5/1988 |
| JP | 03-263376 A | 11/1991 |
| JP | 10-150208 A | 6/1998 |
| JP | 10-242165 A | 9/1998 |
| JP | 10-270451 A | 10/1998 |
| JP | 2001-102577 A | 4/2001 |
| JP | 2004-022716 A | 1/2004 |
| JP | 2005-197497 A | 7/2005 |

* cited by examiner

DISTANCE FROM BOTTOM SURFACE OF COLUMN LAYER ($\mu$m)

DISTANCE FROM BOTTOM SURFACE OF COLUMN LAYER ($\mu$m)

DISTANCE FROM BOTTOM SURFACE OF COLUMN LAYER (μm)

US 8,492,829 B2

SEMICONDUCTOR DEVICE HAVING SUPER JUNCTION METAL OXIDE SEMICONDUCTOR STRUCTURE AND FABRICATION METHOD FOR THE SAME

TECHNICAL FIELD

The present invention relates to a semiconductor device and a fabrication method for such semiconductor device. In particular, the present invention relates to a semiconductor device having a super junction Metal Oxide Semiconductor (MOS) structure, and a fabrication method for such semiconductor device.

BACKGROUND ART

When a MOS Field Effect Transistor (FET) is composed in a bridge circuit, three power loss reductions are required.

The first power loss is on-state power loss. The on-state power loss is a power loss associated with current flowing through a channel of the MOSFET, and reduction of the on resistance of the MOSFET is required.

The second power loss is a switching power loss associated with turn-on switching. In order to reduce the switching power loss associated with the turn-on switching, it is required that a turn-on switching time period should be shortened by increasing a gate sensitivity of the MOSFET and reducing an amount of gate charge Qg needed for the turn-on switching.

The third power loss is a switching power loss associated with the turn-off switching, and is called "through loss". In order to reduce the through loss, it is required that the turn-off switching time should be shortened by shortening Reverse Recovery Time trr of the MOSFET.

As shown in FIG. 11, a MOSFET of planar structure as a semiconductor device related to a conventional example includes: a high resistivity first base layer 12 of a first conductivity type; a drain layer 10 of the first conductivity type formed on the back side surface of the first base layer 12; a second base layer 16 of a second conductivity type formed on the surface of the first base layer 12; a source layer 18 of the first conductivity type formed on the surface of the second base layer 16; a gate insulating film 20 disposed on the surface of both the source layer 18 and the second base layer 16; a gate electrode 22 disposed on the gate insulating film 20; and an interlayer insulating film 24 disposed on the gate electrode 22. In FIG. 12, the illustration is omitted about a drain electrode disposed on the drain layer 10, and a source electrode disposed on both the source layer 18 and the second base layer 16.

FIG. 12 shows an example of a switching waveform of the semiconductor device related to the conventional example.

Although the MOSFET including the super junction MOS structure denotes higher performance in respect of both the switching power loss and the on-state power loss compared with the MOSFET of the conventional planar structure, the performance is poor in respect of the through loss.

That is, the super junction MOSFET includes a column layer of the second conductivity type formed in the first base layer 12 of the lower part of both the second base layer 16 and the source layer 18 by opposing the drain layer 10. Accordingly, the on resistance is reduced and the gate sensitivity increases, the amount of gate charge Qg needed for the turn-on switching is reduced, and thereby the turn-on switching time period can be shortened. On the other hand, since the column layer is included, a pn junction area increases, the reverse recovery time trr increases, and thereby the turn-off switching time is increased. Herein, the amount of gate charge Qg is defined as an amount of charge needed for a voltage $V_{GS}$ between the gate and the source in order to reach 10 V, for example.

Generally, a method of using diffusion of a heavy metal and a method of electron irradiation are known as technology for shortening the reverse recovery time trr. According to the above-mentioned methods, although the reverse recovery time trr can be shortened, since the controllability for forming a trap level is wrong, there is a problem that the leakage current between the drain and the source increases.

Also, in an Insulated Gate Bipolar Transistor (IGBT), it is already proposed about a technology for forming locally a life-time controlled layer (for example, refer to Patent Literature 1).

Moreover, in the IGBT, it is already also disclosed about a technology for irradiating only a predetermined region with an electron ray by using a source electrode formed with aluminum as wiring and using as a mask of electron irradiation (for example, refer to Patent Literature 2).

Patent Literature 1: Japanese Patent Application Laying-Open Publication No. H10-242165 (FIG. 1, and Pages 3-4)

Patent Literature 2: Japanese Patent Application Laying-Open Publication No. H10-270451 (FIG. 1, and Page 4)

SUMMARY OF INVENTION

Technical Problem

The object of the present invention is to provide a semiconductor device including a super junction MOS structure where the reverse recovery time trr can be shortened without increasing the leakage current between the drain and the source, and to provide a fabrication method for such semiconductor device.

Solution to Problem

According to one aspect of the present invention for achieving the above-mentioned object, it is provided of a semiconductor device comprising: a high resistance first base layer of a first conductivity type; a drain layer of the first conductivity type formed on a back side surface of the first base layer; a second base layer of a second conductivity type formed on a surface of the first base layer; a source layer of the first conductivity type formed on a surface of the second base layer; a gate insulating film disposed on a surface of both the source layer and the second base layer; a gate electrode disposed on the gate insulating film; a column layer of the second conductivity type formed in the first base layer of the lower part of both the second base layer and the source layer by opposing the drain layer; a drain electrode disposed in the drain layer; and a source electrode disposed on both the source layer and the second base layer, wherein heavy particle irradiation is performed to the column layer to form a trap level locally.

According to another aspect of the present invention, it is provided of a fabrication method for a semiconductor device, the fabrication method comprising: forming a high resistance first base layer of a first conductivity type; forming a drain layer of the first conductivity type on a back side surface of the first base layer; forming a second base layer of a second conductivity type on a surface of the first base layer; forming a source layer of the first conductivity type on a surface of the second base layer; forming a gate insulating film on a surface of both the source layer and the second base layer; forming a gate electrode on the gate insulating film; forming a column layer of the second conductivity type in the first base layer of a lower part of both the second base layer and the source layer by opposing the drain layer; forming a drain electrode in the drain layer, forming a source electrode on both the source layer and the second base layer; and performing heavy particle irradiation to the column layer and forming a trap level locally.

Advantageous Effects of Invention

According to the present invention, it can be provided of the semiconductor device including the super junction MOS structure where the reverse recovery time trr can be shortened without increasing the leakage current between the drain and the source, and can be provided of the fabrication method for such semiconductor device.

DESCRIPTION OF EMBODIMENTS

Figure 1:
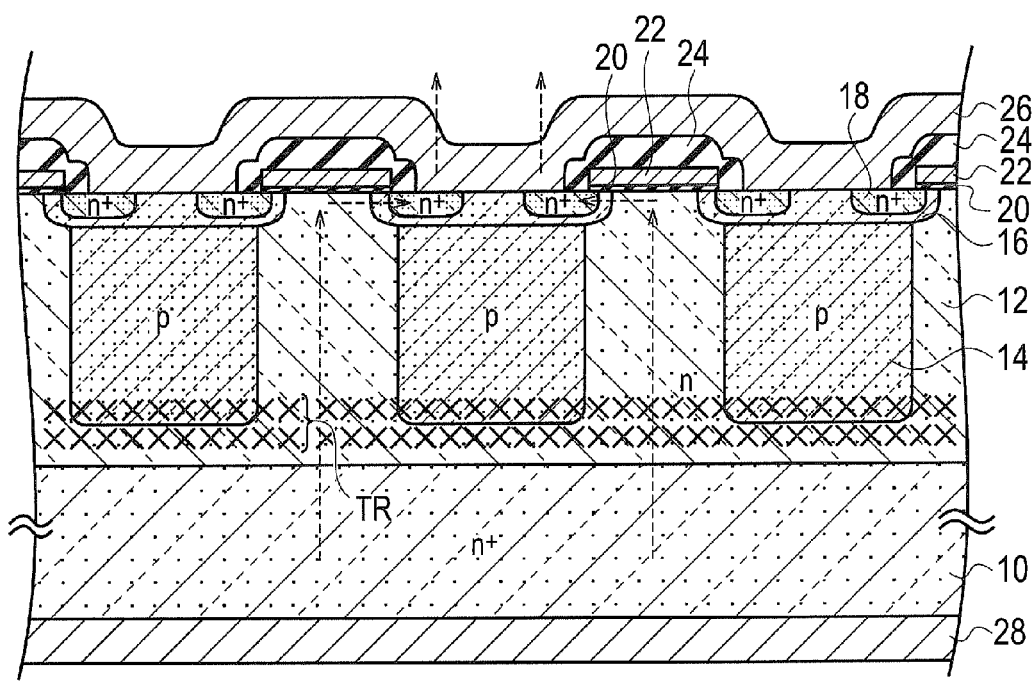
FIG. 1 A schematic cross-sectional configuration diagram of a semiconductor device according to a first embodiment of the present invention.

Next, embodiments of the present invention will be described with reference to drawings. It explains simple by attaching the same reference numeral as the same block or element to below, in order to avoid duplication of description. However, the drawings are schematic and it should care about differing from an actual thing. Of course, the part from which the relation or ratio between the mutual sizes differ also in mutually drawings may be included.

The embodiments shown in the following exemplifies the device and method for materializing the technical idea of the present invention, and the embodiments of the present invention does not specify assignment of each component parts, etc. as the following. Various changes can be added to the technical idea of the present invention in scope of claims.

First Embodiment

Element Structure

FIG. 1 shows a schematic cross-section structure of a semiconductor device according to a first embodiment of the present invention. Moreover, FIG. 2 shows a schematic bird's-eye view structure of the semiconductor device according to the first embodiment.

Figure 2:
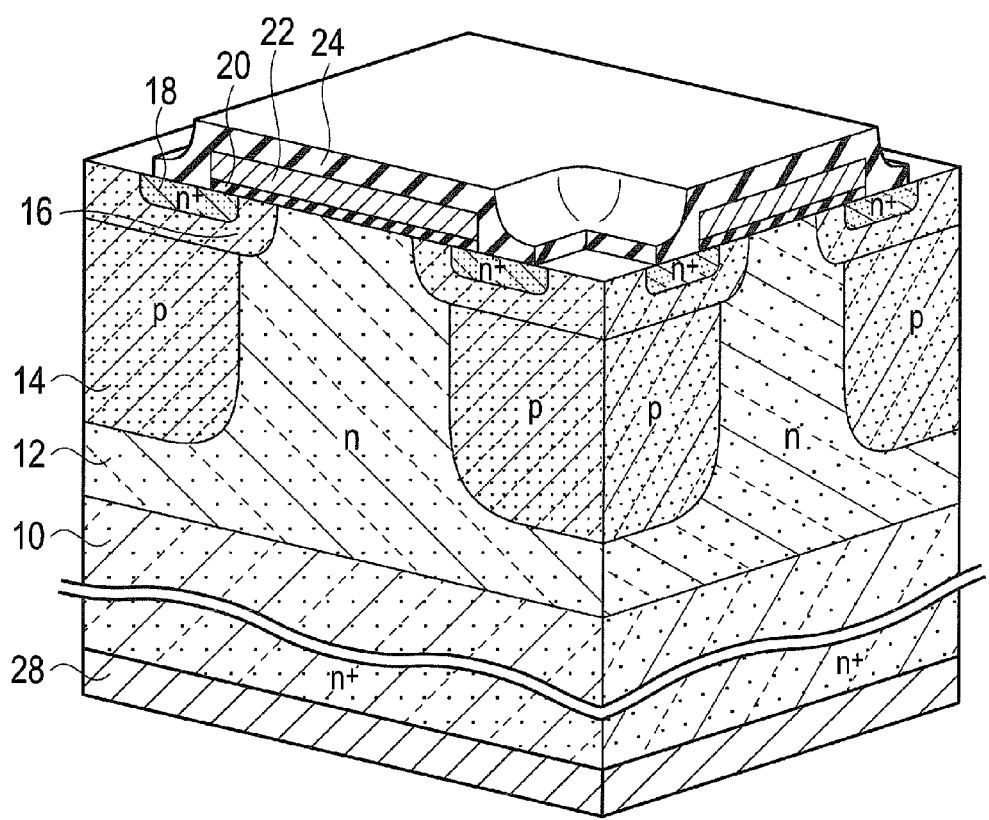
FIG. 2 A schematic bird's-eye view of the semiconductor device according to the first embodiment of the present invention.

As shown in FIG. 1 to FIG. 2, the semiconductor device according to the first embodiment includes: an n type impurity doped high resistivity first base layer 12; an n type impurity doped drain layer 10 disposed on the back side surface of the first base layer 12; a p type impurity doped second base layer 16 formed on the surface of the first base layer 12; an n type impurity doped source layer 18 formed on the surface of the second base layer 16; a gate insulating film 20 disposed on the surface of both the source layer 18 and the second base layer 16; a gate electrode 22 disposed on the gate insulating film 20; a p type impurity doped column layer 14 formed in the first base layer 12 of the lower part of both the second base layer 16 and the source layer 18 by opposing the drain layer 10; a drain electrode 28 disposed in the drain layer 10; and a source electrode 26 disposed on both the source layer 18 and the second base layer 16. An interlayer insulating film 24 is disposed on the gate electrode 22. Dashed lines shown in FIG. 1 indicate current which flows between the drain and the source. As clearly illustrated in FIGS. 1 and 2, the column layer 14 extends in a first direction vertical to principal surface of the drain layer 10, a length of the column layer 14 in the first direction being larger than a length thereof in a second direction that is parallel to the principal surface of the drain layer 10. The column layer 14 and the first base layer 12 are repeatedly alternately-arranged in the second direction.

In the semiconductor device according to the first embodiment, a trap level (see "TR" in FIG. 1) is formed locally by performing heavy particle irradiation to the column layer 14. Thus, as illustrated in FIG. 1, the trap level is formed below the second base layer 16.

P, As, Sb, etc. can be applied as the n type impurity, and B, Al, Ga, etc. can be applied as the p type impurity, for example. The above-mentioned impurities can be doped on each layer using diffusion technology or ion implantation technology.

A silicon dioxide film, a silicon nitride film, a silicon oxynitride film, a hafnium oxide film, an alumina film, a tantalum oxide film, etc. can be applied, for example, as the gate insulating film 20.

Polysilicon can be applied as the gate electrode 22, and aluminum can be applied to both the drain electrode 28 and the source electrode 26, for example.

A silicon dioxide film, a silicon nitride film, a tetraethoxy silane (TEOS) film, etc. are applicable, for example, as the interlayer insulating film 24.

Figure 3:
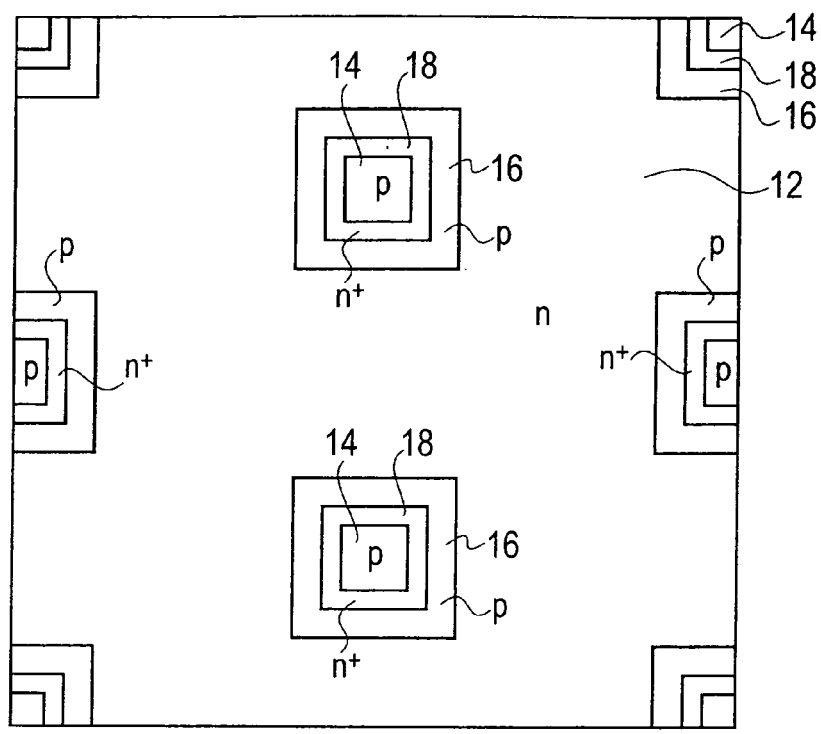
FIG. 3 A schematic planar pattern configuration diagram of the semiconductor device according to the first embodiment of the present invention.
Figure 4:
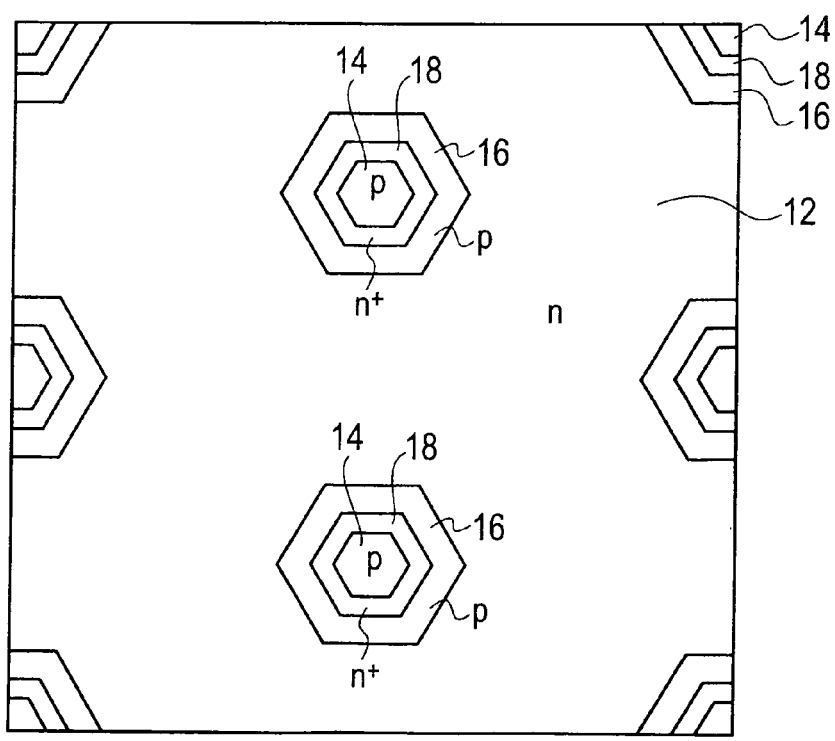
FIG. 4 An alternative schematic planar pattern configuration diagram of the semiconductor device according to the first embodiment of the present invention.

In the example of FIG. 2, the schematic planar pattern configuration of the semiconductor device according to the first embodiment shows an example which is disposed being checkered lattice-like on the basis of a rectangular pattern. On the other hand, as shown in FIG. 3, the planar pattern configuration may be disposed being zigzagged checkered lattice-like on the basis of a rectangular pattern, for example. Alternatively, as shown in FIG. 4, the planar pattern configuration may be disposed being zigzagged checkered lattice-like on the basis of a hexagonal pattern, for example. Moreover, the planar pattern configuration is not limited to the rectangle or the hexagon. That is, the planar pattern configuration is also effective on the basis of circular, an oval figure, a pentagon, a polygon greater than heptagon, etc. Each of FIG. 3 and FIG. 4 shows schematically the pattern of semiconductor layers, such as the first base layer 12, the column layer 14, the second base layer 16, and the source layer 18. However, illustrating of the gate electrode 22, the source electrode 26, etc. is omitted.

Figure 5:
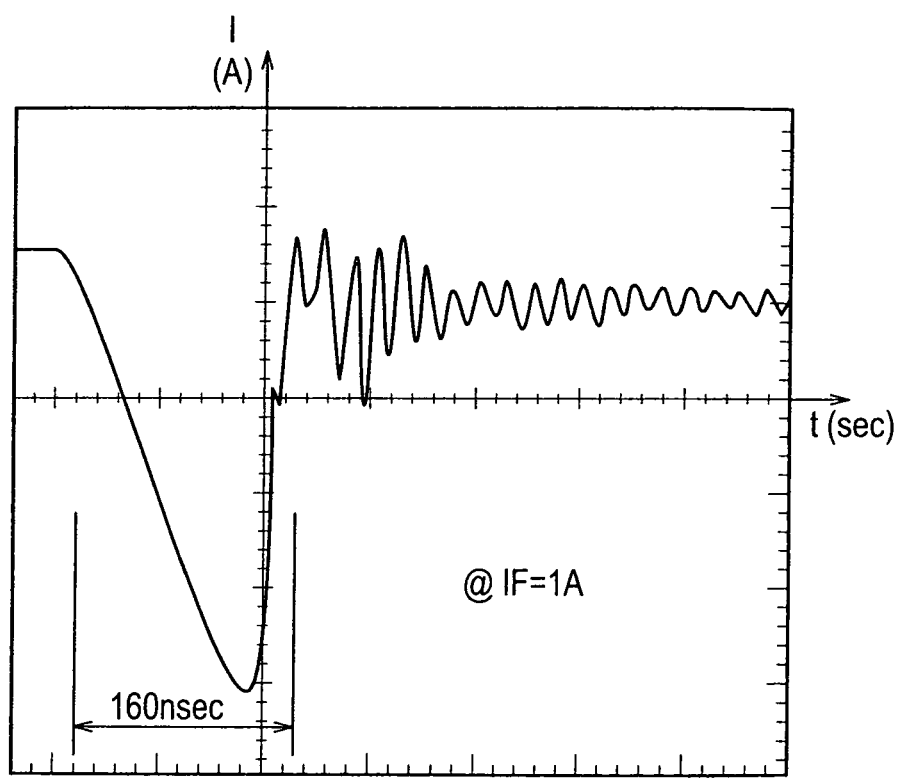
FIG. 5 An example of a switching waveform of a comparative example of the semiconductor device according to the first embodiment of the present invention.
Figure 12:
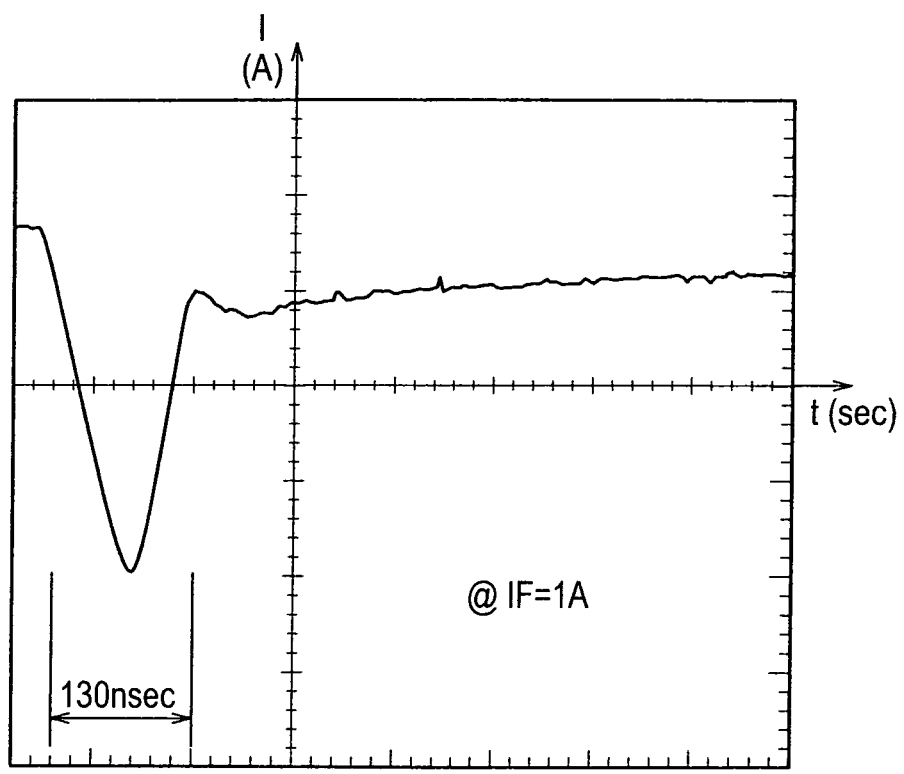
FIG. 12 An example of a switching waveform of the semiconductor device according to the conventional example.

FIG. 5 shows an example of a switching waveform in the comparative example which does not control life time by the heavy particle irradiation, in the semiconductor device according to the first embodiment. The reverse recovery time trr is 160 nsec according to a result shown in FIG. 5, and is longer than the reverse recovery time being 130 nsec of the conventional example shown in FIG. 12.

Figure 6:
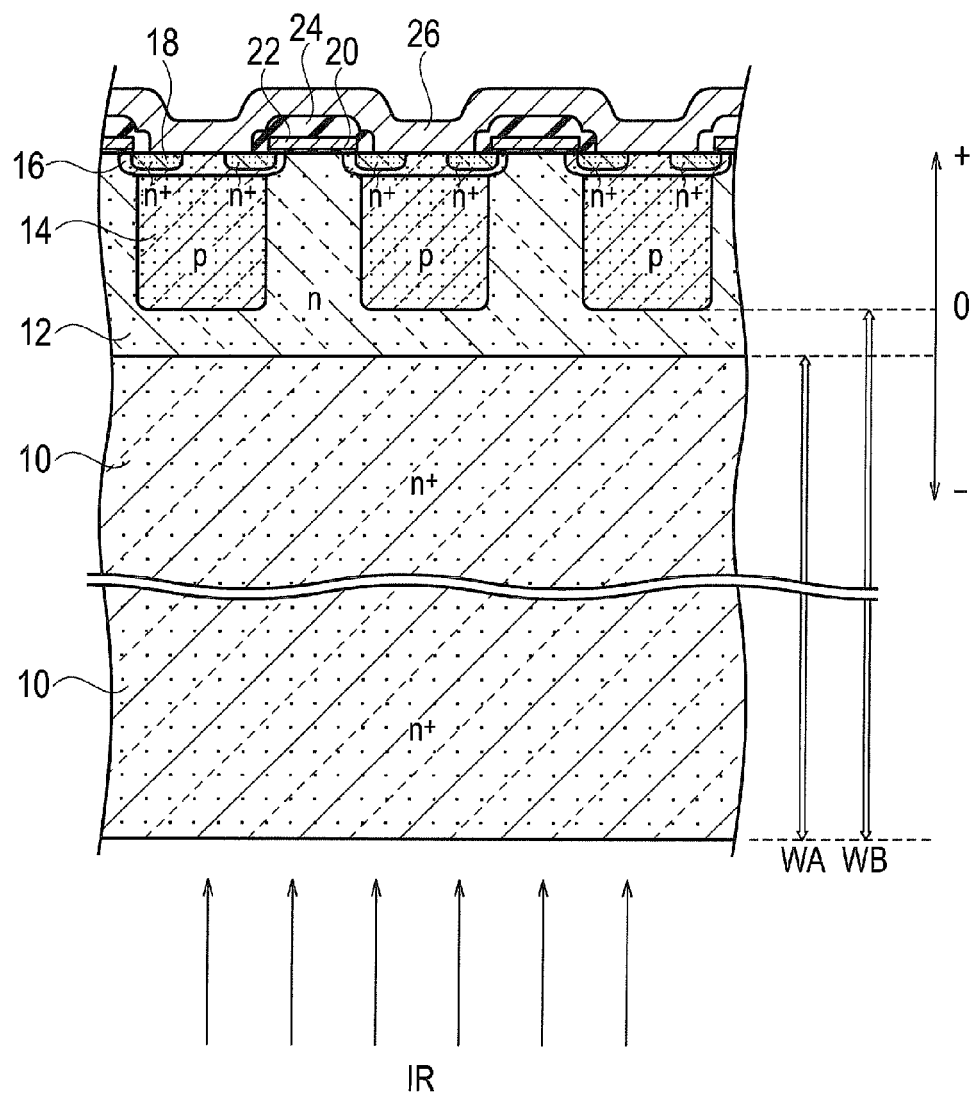
FIG. 6 The schematic cross-sectional configuration diagram explaining the relation between the irradiation target position and the device structure, in the case of $^3$He$^{++}$ ion irradiation to the semiconductor device according to the first embodiment of the present invention from a back side surface.

FIG. 6 shows a schematic cross-section structure for explaining the relation between an irradiation target position and device structure, in the case of performing $^3$He$^{++}$ ion irradiation (IR) to the semiconductor device according to the first embodiment from the back side surface.

In FIG. 6, WA denotes the thickness of the drain layer 10 measured from the back side surface of the semiconductor device. Also, WB denotes the distance to the bottom surface of the column layer 14 measured from the back side surface of the semiconductor device. In the example shown in FIG. 6, it is WA=208 μm, and is WB=220 μm.

Moreover, as shown in FIG. 6, a coordinate system is defined by applying the direction of the source electrode 26 into a positive direction and applying the direction of the drain layer 10 into a negative direction on the basis of the bottom surface of the column layer 14. The irradiation target position can be defined as an attenuation peak position of the range of the heavy ion irradiated from the back side surface of the semiconductor device, and can be indicated on the above-mentioned coordinate system.

(Result of Experiment)

Figure 7:
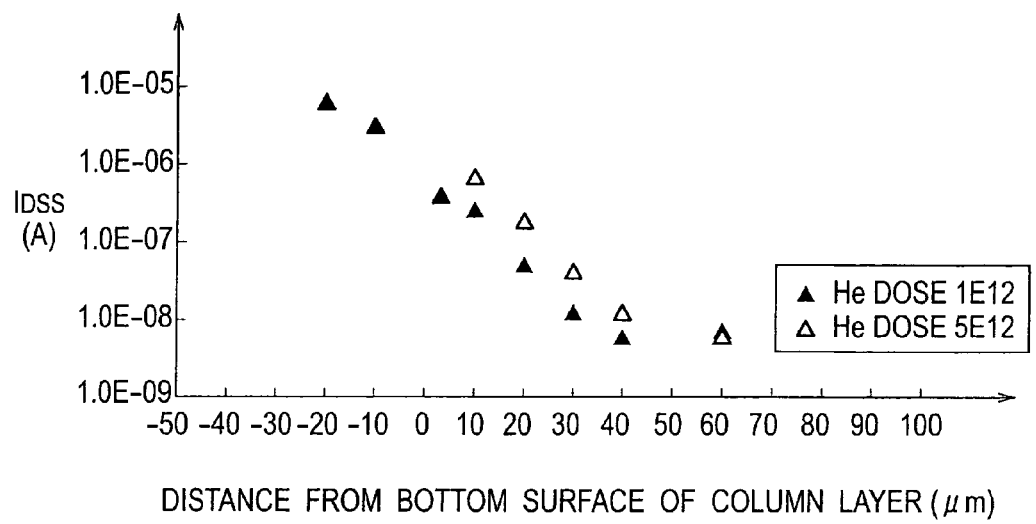
FIG. 7 A diagram showing the relation between a saturation current $I_{DSS}$ between the drain and the source and a distance from a bottom surface of a column layer, in the semiconductor device according to the first embodiment of the present invention.

FIG. 7 shows the relation between the saturation current $I_{DSS}$ between the drain and the source and the distance from the bottom surface of the column layer 14 corresponding to the attenuation peak position, in the semiconductor device according to the first embodiment. FIG. 7 shows the case of the amount of dosage of $^3$He$^{++}$ ion is set to $1\times10^{12}/\text{cm}^2$, and is set to $5\times10^{12}/\text{cm}^2$.

Figure 8:
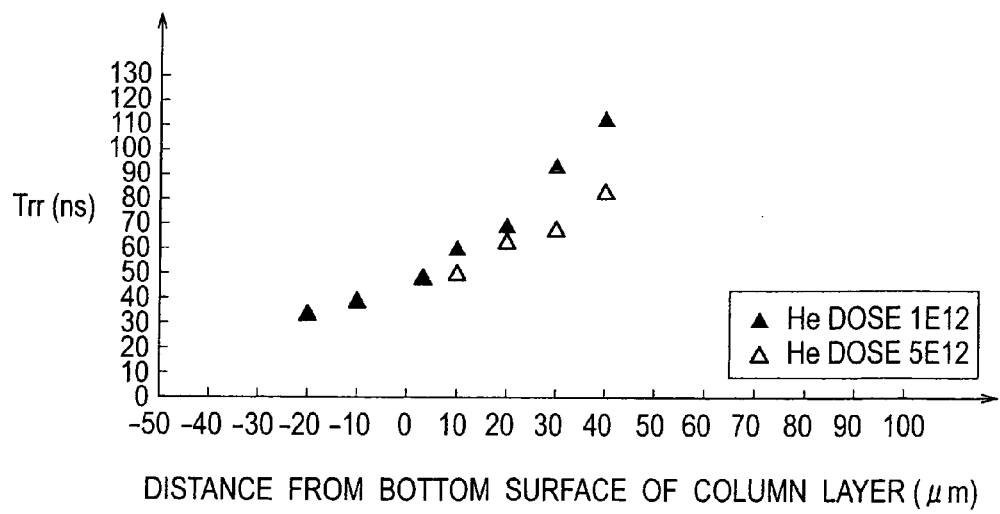
FIG. 8 A diagram showing the relation between the reverse recovery time trr and the distance from the bottom surface of the column layer, in the semiconductor device according to the first embodiment of the present invention.

Moreover, FIG. 8 shows the relation between the reverse recovery time trr and the distance from the bottom surface of the column layer 14 corresponding to the attenuation peak position, in the semiconductor device according to the first embodiment. FIG. 8 also shows the case of the amount of dosage of $^3$He$^{++}$ ion is set to $1\times10^{12}/\text{cm}^2$, and is set to $5\times10^{12}/\text{cm}^2$.

As clearly from FIG. 7, the value of the saturation current $I_{DSS}$ between the drain and the source tends to decrease as the distance from the bottom surface of the column layer 14 corresponding to the attenuation peak position increases. On the other hand, as clearly from FIG. 8, the reverse recovery time trr tends to increase as the distance from the bottom surface of the column layer 14 corresponding to the attenuation peak position increases.

Figure 9:
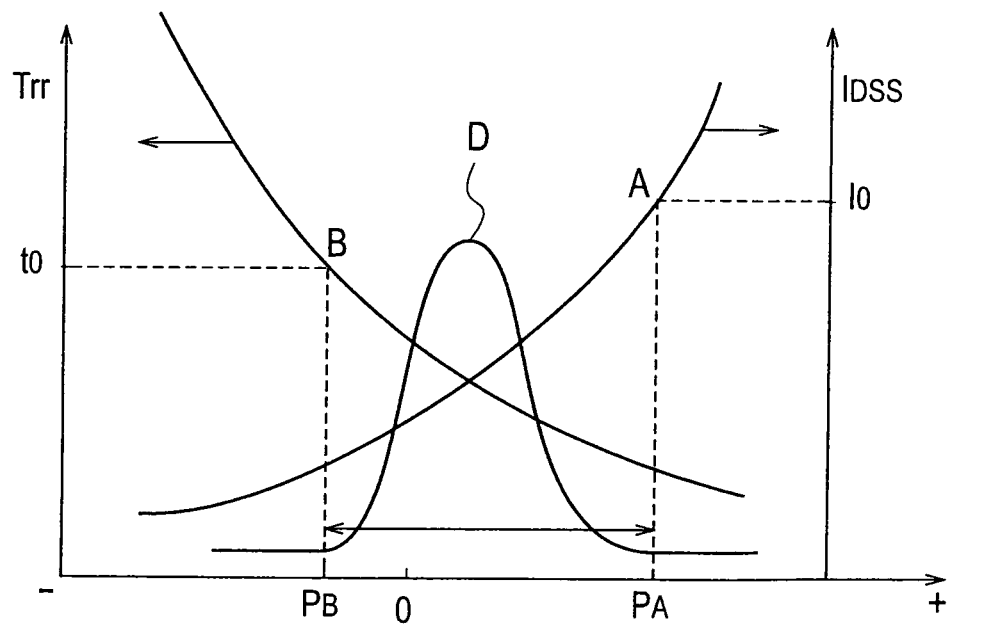
FIG. 9 A schematic diagram showing the relation between the reverse recovery time trr and the saturation current $I_{DSS}$ between the drain and the source and the distance from the bottom surface of the column layer, in the semiconductor device according to the first embodiment of the present invention.

FIG. 9 shows schematically the relation between: the reverse recovery time trr and the saturation current $I_{DSS}$ between the drain and the source; and the distance from the bottom surface of the column layer 14, in the semiconductor device according to the first embodiment.

In the semiconductor device according to the first embodiment, the heavy particle irradiation is performed so that the attenuation peak position of the heavy particle irradiation may be included between: the first position PB obtained from the relation between the distance from the bottom surface of the column layer 14 and the reverse recovery time trr on the basis of the bottom surface of the column layer 14; and the second position PA obtained from the relation between the distance from the bottom surface of the column layer 14 and the saturation current $I_{DSS}$ between the drain and the source, and thereby it can be obtained of the semiconductor device having the reverse recovery time trr shorter than the reverse recovery time $t_0$, and having the saturation current $I_{DSS}$ between the drain and the source smaller than the saturation current $I_0$ between the drain and the source. In FIG. 9, the curve D denotes the attenuation peak curve of the heavy particle irradiation for obtaining the semiconductor device having the reverse recovery time trr shorter than the reverse recovery time $t_0$, and having the saturation current $I_{DSS}$ between the drain and the source smaller than the saturation current $I_0$ between the drain and the source.

Here, the first position PB is the attenuation peak position of the heavy particle irradiation corresponding to the reverse recovery time $t_0$. Moreover, the second position PA is the attenuation peak position of the heavy particle irradiation corresponding to the saturation current $I_0$ between the drain and the source. For example, when the reverse recovery time $t_0$ is set to 80 nsec and the saturation current $I_0$ between the drain and source is set to 1 μA, it can be obtained of the semiconductor device whose the reverse recovery time trr<$t_0$=80 nsec, and the saturation current between the drain and the source $I_{DSS}$<$I_0$=1 μA.

Here, a proton, $^3$He$^{++}$, or $^4$He$^{++}$ can be used for the particle species for performing the heavy particle irradiation, for example. When using $^4$He$^{++}$ as the particle species for performing the heavy particle irradiation, it is preferable to use the drain layer 10 composed of a thin substrate.

The amount of dosage of the heavy particle irradiation can be set as the scope of $5\times10^{10}/\text{cm}^2$ to $5\times10^{12}/\text{cm}^2$, for example.

Figure 10:
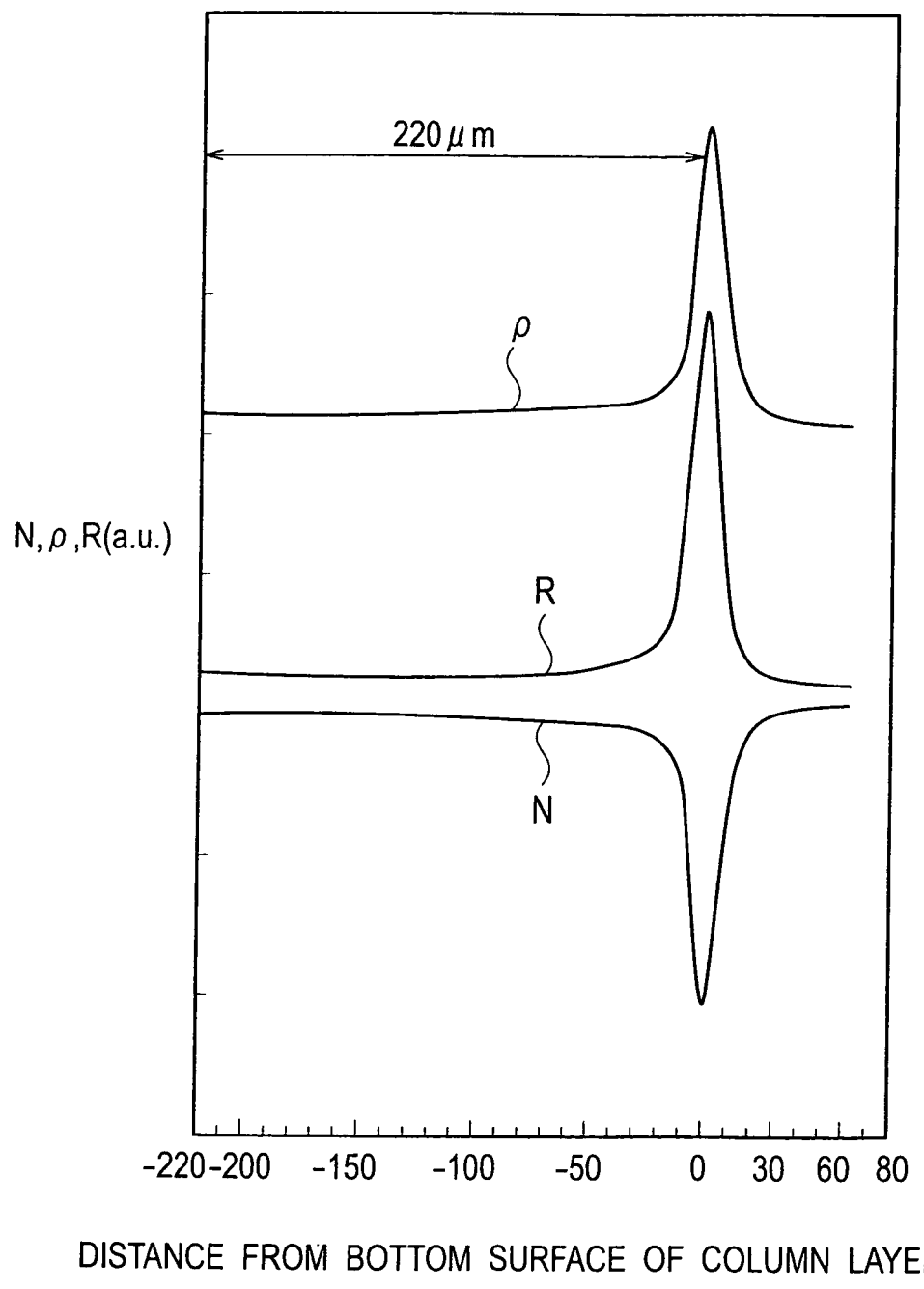
FIG. 10 A diagram showing the relation between impurity concentration N, resistivity and sheet resistance R and the distance from the bottom surface of the column layer, in the semiconductor device related to the first embodiment of the present invention.
Figure 11:
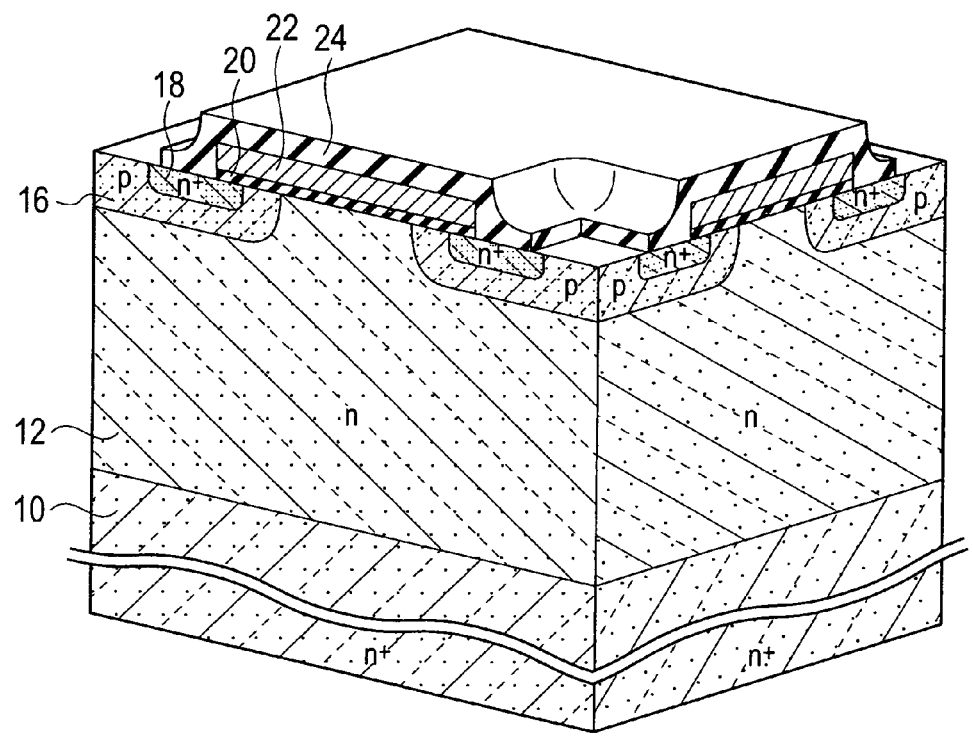
FIG. 11 A schematic bird's-eye view of a semiconductor device according to a conventional example.

FIG. 10 shows the relation between the impurity concentration N, the resistivity ρ, and sheet resistance R and the distance from the bottom surface of the column layer 14, in the semiconductor device according to the first embodiment. Corresponding to the tendency of the attenuation peak curve of heavy particle irradiation, the peak characteristics that the resistivity ρ and sheet resistance R increase are shown, and the peak characteristics that the impurity concentration N decreases are shown.

(Fabrication Method)

As shown in FIG. 1 to FIG. 2, a fabrication method of the semiconductor device according to the first embodiment includes: the step of forming a high resistivity first base layer 12 of a first conductivity type; the step of forming a drain layer 10 of the first conductivity type on the back side surface of the first base layer 12; the step of forming a second base layer 16 of a second conductivity type on the surface of the first base layer 12; the step of forming a source layer 18 of the first conductivity type on the surface of the second base layer 16; the step of forming a gate insulating film 20 on the surface of both the source layer 18 and the second base layer 16; the step of forming a gate electrode 22 on the gate insulating film 20; the step of forming a column layer 14 of the second conductivity type in the first base layer 12 of the lower part of both the second base layer 16 and the source layer 18 by opposing the drain layer 10; the step of forming a drain electrode 28 in the drain layer 10; the step of forming a source electrode in both the source layer and the second base layer; and the step of performing heavy particle irradiation to the column layer 14 and forming a trap level locally.

As shown in FIG. 9, the step of forming the trap level locally includes: the step of determining a first position PB based on the relation between the distance from the bottom surface of the column layer 14 and the reverse recovery time trr on the basis of the bottom surface of the column layer 14; the step of determining a second position PA obtained from the relation between the distance from the bottom surface of the column layer 14 and the saturation current $I_{DSS}$ between the drain and the source; and the step of performing the heavy particle irradiation so that an attenuation peak position may be included between the first position PB and the second position PA.

According to the first embodiment, it can achieve controlling degradation of both the saturation current $I_{DSS}$ between the drain and the source and the threshold value voltage between the gate and the source, and improving the reverse recovery characteristics of a built-in diode. Thus, it is possible to reduce the switching power loss, and reduce the diode reverse recovery loss.

According to the first embodiment, it can be provided of the semiconductor device including the super junction MOS structure where the reverse recovery time trr can be shortened without increasing the leakage current between the drain and the source, and can be provided of the fabrication method for such semiconductor device.

Other Embodiments

The present invention has been described by the first embodiment, as a disclosure including associated description and drawings to be construed as illustrative, not restrictive. With the disclosure, a person skilled in the art might easily think up alternative embodiments, embodiment examples, or application techniques.

Thus, the present invention includes various embodiments etc. which have not been described in this specification.

INDUSTRIAL APPLICABILITY

The semiconductor device according to the present invention is applicable to a bridge circuit, a LCD inverter, a motor, automotive High Intensity Discharge lamp (HID) headlight lighting apparatus, etc. which use a high breakdown voltage MOSFET.

REFERENCE SIGNS LIST

10: Drain layer;
12: First base layer;
14: Column layer;
16: Second base layer;
18: Source layer;
20: Gate insulating film;
22: Gate electrode;
24: Interlayer insulating film;
26: Source electrode; and
28: Drain electrode.

The invention claimed is:

1. A semiconductor device comprising:
a high resistance first base layer of a first conductivity type;
a drain layer of the first conductivity type formed on a back side surface of the first base layer;
a second base layer of a second conductivity type formed in a surface side of the first base layer;
a source layer of the first conductivity type formed in a surface side of the second base layer;
a gate insulating film disposed on a surface of both the source layer and the second base layer;
a gate electrode disposed on the gate insulating film;
a column layer of the second conductivity type formed in the first base layer below both the second base layer and the source layer by opposing the drain layer, the column layer extending in a first direction vertical to a principal surface of the drain layer, a length of the column layer in the first direction being larger than a length thereof in a second direction that is parallel to the principal surface of the drain layer;
a drain electrode disposed in the drain layer; and
a source electrode disposed on both the source layer and the second base layer, wherein
the column layer and the first base layer are repeatedly alternately-arranged in the second direction,
heavy particle irradiation is performed to the column layer to form a trap level locally, and
the trap level is formed below the second base layer.

2. The semiconductor device according to claim 1, wherein an attenuation peak position of an ion irradiation is included between: a first position obtained from a relation between the distance from a bottom surface of the column layer and reverse recovery time; and a second position obtained from a relation between the distance from the bottom surface of column layer and a saturation current between the drain and the source, on the basis of the bottom surface of the column layer.

3. The semiconductor device according to claim 1, wherein the particle species for performing the heavy particle irradiation is one of a proton, $^3He^{++}$, and $^4He^{++}$.

4. The semiconductor device according to claim 1, wherein an amount of dosage of the heavy particle irradiation is $5\times10^{10}/cm^2$ to $5\times10^{12}/cm^2$.

5. The semiconductor device according to claim 1, wherein a planar pattern on the basis of one of a rectangle and a hexagon is disposed being checkered lattice-like or zigzagged checkered lattice-like, in the first base layer, the second base layer, and the source layer.

6. The semiconductor device according to claim 1, wherein a bottom surface of the column layer and the drain layer are separated by the first base layer.

7. The semiconductor device according to claim 1, wherein the trap level extends over the column layer and the first base layer.

8. The semiconductor device according to claim 1, wherein a distance between two neighboring column layers is smaller than a width of each of the column layers.

* * * * *